United States Patent
Kim et al.

(10) Patent No.: US 9,332,649 B2
(45) Date of Patent: May 3, 2016

(54) FLEXIBLE PRINTED CIRCUIT BOARD FOR PACKAGING SEMICONDUCTOR DEVICE AND METHOD OF PRODUCING THE SAME

(71) Applicant: Magnachip Semiconductor, Ltd., Cheongju-si (KR)

(72) Inventors: DoYoung Kim, Goyang-si (KR); KyungDuk Kim, Goyang-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 50 days.

(21) Appl. No.: 14/066,905

(22) Filed: Oct. 30, 2013

(65) Prior Publication Data

US 2014/0131889 A1    May 15, 2014

(30) Foreign Application Priority Data

Nov. 13, 2012  (KR) .................. 10-2012-0128367

(51) Int. Cl.
*H01L 23/495* (2006.01)
*H05K 3/10* (2006.01)
*H01L 23/498* (2006.01)
*H01L 23/552* (2006.01)
*H05K 1/02* (2006.01)
*H05K 1/18* (2006.01)

(52) U.S. Cl.
CPC .............. *H05K 3/10* (2013.01); *H01L 23/4985* (2013.01); *H01L 23/49838* (2013.01); *H01L 23/552* (2013.01); *H05K 1/0219* (2013.01); *H01L 2224/73204* (2013.01); *H05K 1/189* (2013.01); *H05K 2201/09618* (2013.01); *H05K 2201/09781* (2013.01); *Y10T 29/49155* (2015.01)

(58) Field of Classification Search
CPC .............. H01L 23/552; H01L 23/4985; H01L 23/49838; H01L 24/17
USPC .................. 257/673, 701, 702, 698, E23.065
See application file for complete search history.

(56) References Cited

U.S. PATENT DOCUMENTS

| | | | | |
|---|---|---|---|---|
| 5,283,677 A | * | 2/1994 | Sagawa et al. ................. | 349/150 |
| 5,341,233 A | * | 8/1994 | Tomoike et al. ............... | 349/150 |
| 5,739,887 A | * | 4/1998 | Ueda ................. | G02F 1/133604 |
| | | | | 349/149 |
| 6,054,975 A | * | 4/2000 | Kurokawa et al. ............ | 345/100 |
| 6,426,011 B1 | | 7/2002 | Katoh | |
| 7,268,424 B2 | * | 9/2007 | Kajimoto ............. | G06K 19/077 |
| | | | | 257/701 |

(Continued)

FOREIGN PATENT DOCUMENTS

| | | |
|---|---|---|
| CN | 1830233 A | 9/2006 |
| CN | 1901179 A | 1/2007 |

(Continued)

OTHER PUBLICATIONS

Taiwanese Office Action issued on Oct. 22, 2015 in counterpart Taiwanese Application No. 102140926. (15 pages with English translation).

(Continued)

*Primary Examiner* — Nitin Parekh
(74) *Attorney, Agent, or Firm* — NSIP Law

(57) ABSTRACT

A flexible circuit board, a semiconductor package, and methods of forming the same are provided. The flexible circuit board includes: a base film; an input line pattern, an output line pattern, and a dummy pattern on a first surface of the base film; and a ground pattern on a second surface of the base film and electrically connected with the dummy pattern.

13 Claims, 11 Drawing Sheets

(56) References Cited

U.S. PATENT DOCUMENTS

| | | | |
|---|---|---|---|
| 7,719,106 B2* | 5/2010 | Kajimoto | G06K 19/077 257/701 |
| 2001/0015709 A1* | 8/2001 | Imajo | G02F 1/13452 345/87 |
| 2001/0048109 A1* | 12/2001 | Murade | 257/72 |
| 2005/0052442 A1* | 3/2005 | Takenaka | G02F 1/13452 345/204 |
| 2008/0096294 A1 | 4/2008 | Liu et al. | |
| 2009/0079047 A1* | 3/2009 | Nakayama | H01L 23/49838 257/668 |
| 2010/0038117 A1* | 2/2010 | Chung et al. | 174/254 |
| 2013/0043584 A1* | 2/2013 | Kwon et al. | 257/737 |

FOREIGN PATENT DOCUMENTS

| | | |
|---|---|---|
| JP | 4-64277 B2 | 10/1992 |
| JP | 2916824 B2 | 7/1999 |
| TW | I302212 B | 10/2008 |

OTHER PUBLICATIONS

Chinese Office Action issued on Nov. 27, 2015 in counterpart Chinese Application No. 201310565531.08. (10 pages, in Chinese).

* cited by examiner

FLEXIBLE PRINTED CIRCUIT BOARD FOR PACKAGING SEMICONDUCTOR DEVICE AND METHOD OF PRODUCING THE SAME

CROSS-REFERENCE TO RELATED APPLICATION

This application claims the benefit under 35 U.S.C. §119(a) of Korean Application No. 10-2012-0128367, filed on Nov. 13, 2012, in the Korean Intellectual Property Office, the entire disclosure of which is incorporated herein by reference for all purposes.

BACKGROUND

1. Field

The following description relates to a flexible printed circuit board, a semiconductor package, and a method of producing the same, and to, for example, a flexible printed circuit board and a semiconductor package that can prevent errors from occurring by reducing noise caused by a driving integrated circuit.

2. Description of Related Art

Recently, with the development of various portable electronic devices, such as mobile phones, PDA's, and notebook computers, and large-screen TV's, the demand for a light-weight, thin, short and small flat panel display device that may be applied to various portable electronic devices and large-screen TV's has been increasing. As such, flat panel display devices, liquid crystal display devices, plasma display panels, organic light emitting display devices, electrophoresis display devices, and the like, have been actively studied. Among them, liquid crystal display devices have received much attention due to the possibility of mass production, the ease in driving such a device, its high picture quality, and the ability to produce a large-size screen.

Liquid crystal display devices have been applied to various electronic devices such as large-screen TV's as well as electronic devices having a small screen, such as mobile devices.

A liquid crystal display device displays an image by controlling the light transmittance of a liquid crystal layer by using an electric field. To this end, the liquid crystal display device includes a liquid crystal display panel having a liquid crystal cell, a back light unit irradiating light to the liquid crystal display panel, and a driving circuit for driving the liquid crystal cell.

The liquid crystal display device configured as above needs a plurality of driving integrated circuits connected to a plurality of data and gate lines, for supplying a data signal and a scan signal to the data lines and the gate lines, respectively.

The driving integrated circuits are intended to supply a signal, which is supplied from a printed circuit board (PCB), to the liquid crystal display panel, wherein parts generating various control signals and data signals are mounted on the PCB. A method for packaging the display device may be divided into a chip on glass (COG) method and a chip on film (COF) method.

The chip on glass (COG) method involves directly mounting the display device on an array substrate of the liquid crystal display panel. However, with the chip on the glass (COG) method, a volume of the liquid crystal display device increases. On the other hand, since the chip on film (COF) method packages the display device on a film-type flexible circuit board, a volume of the liquid crystal display device may be reduced.

SUMMARY

In one general aspect, there is provided a flexible circuit board including: a base film; an input line pattern, an output line pattern, and a dummy pattern on a first surface of the base film; and a ground pattern on a second surface of the base film and electrically connected with the dummy pattern.

The base film may include a hole, and the ground pattern may be electrically connected with the dummy pattern through the hole.

The dummy pattern may be connected with an adjacent second dummy pattern.

The dummy pattern may be formed in a polygonal shape, a circle shape or an oval shape.

The dummy pattern may be one of a plurality of dummy patterns formed on the first surface of the base film; the input line pattern or output line pattern may be one of a plurality of input line patterns or output line patterns formed on the first surface of the base film; and the plurality of dummy patterns may be formed between the plurality of input line patterns or between the plurality of output line patterns.

The input line pattern, the output line pattern, the dummy pattern and the ground pattern may include a conductive material.

The base film may include a plurality of holes formed therein, and the dummy pattern may be electrically connected with the ground pattern through the plurality of holes.

The hole may be filled with a conductive material to electrically connect the dummy pattern with the ground pattern.

In another general aspect, there is provided a semiconductor package, comprising: a base film; an input line pattern, an output line pattern, and a dummy pattern on a first surface of the base film; a ground pattern on a second surface of the base film and electrically connected with the dummy pattern; and a display device mounted on the base film and connected with the input line pattern and the output line pattern.

The base film may include a hole, and the ground pattern may be electrically connected with the dummy pattern through the hole.

The display device may be electrically connected with the dummy pattern.

The display device may be electrically insulated from the dummy pattern.

In another general aspect, there is provided a flexible circuit board including: a base film comprising an inner lead region where a display device is mounted and an outer lead region bonded with an external device; an input line pattern and an output line pattern on a first surface of the base film; at least one dummy pattern on the first surface of the base film; and a ground pattern on a second surface of the base film and connected with the dummy pattern through a hole provided in the base film, the at least one dummy pattern being configured to channel noise to the ground pattern.

In yet another general aspect, there is provided a semiconductor package including: a base film comprising an inner lead region where a display device is mounted and an outer lead region bonded with an external device; an input line pattern and an output line pattern on a first surface of the base film; at least one dummy pattern on the first surface of the base film; a ground pattern on a second surface of the base film and connected with the dummy pattern through a hole provided in the base film, the at least one dummy pattern being configured to channel noise to the ground pattern; and a display device mounted on the inner lead region of the base film and connected with the input line pattern and the output line pattern.

In another general aspect, there is provided a method of fabricating a printed circuit board, the method including: forming a ground pattern and a dummy pattern on two opposite sides of a base film; and electrically connecting the ground pattern to the dummy pattern via a hole formed in the base film.

The method may further involve: prior to the electrical connecting of the ground pattern to the dummy pattern, forming a metal thin film layer on the base film and forming the hole through both the metal thin layer and the base film.

The method may further involve: prior to the electrical connecting of the ground pattern and the dummy, etching the metal thin film layer to form a portion of the dummy pattern and a portion of an input line pattern or an output line pattern.

The dummy pattern may be formed between two or more input line patterns on a surface of the base film.

Other features and aspects may be apparent from the following detailed description, the drawings, and the claims.

Figure 1:
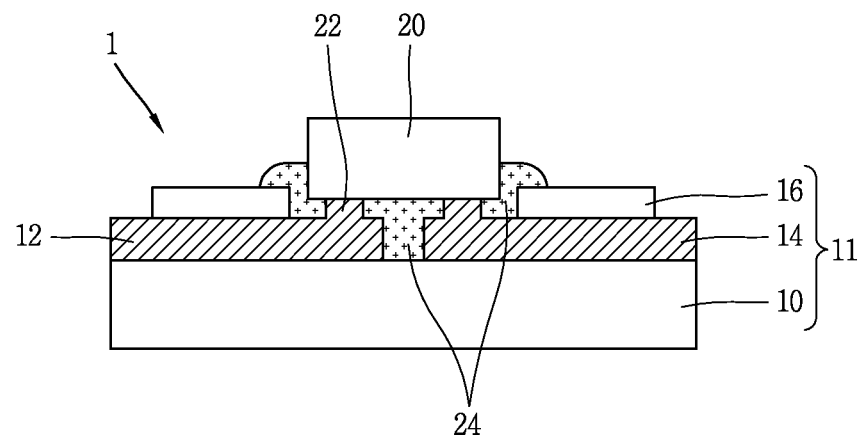
FIG. 1 is a cross-sectional view illustrating an example of a flexible circuit board for a semiconductor package.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

Hereinafter, various examples of flexible printed circuit boards and methods of producing the same will be described in detail with reference to the accompanying drawings.

In the various examples of flexible printed circuit boards described below, to reduce or eliminate the noise occurring in a driving integrated circuit, an additional noise removing circuit may be formed. In the alternative, the noise may be reduced in a simple manner without a specially designed circuit for removing the noise from a signal, or without packaging a portion of the device to remove or block the noise.

According to various examples described herein, a ground pattern may be formed on a flexible circuit board, and the noise that occurs in a display device may be channeled to the ground pattern. Thus, the noise may be reduced in a simple manner without a specially designed circuit for removing the noise.

FIG. 1 illustrates a cross-sectional view of an example of a chip on film (COF) flexible circuit board with a display device or a chip including a driving integrated circuit that is mounted on the flexible circuit board.

Referring to FIG. 1, a flexible circuit board 1 includes a base film 10 of an insulating material, and an input line pattern 12 and an output line pattern 14 that are formed on a first surface of the base film 10. In this instance, the first surface is an upper surface of the base film 10.

As shown in FIG. 1, the display device 20 is mounted on the base film 10, and its terminal (not shown) is electrically connected with the input line pattern 12 and the output line pattern 13 through a bonding member 22 such as a bump.

In this example, the display device 20 is mounted on the base film 10 in a flip chip manner, and protects the mounted portion by depositing a resin 24 such as epoxy in the periphery of the mounted display device 20. An insulating layer 16 is formed on the first surface of the base film 10 where the input line pattern 12 and the output line pattern 13 are formed, thereby covering the input line 12 and the output line 13.

However, with the aforementioned flexible circuit board, noises from the driving circuit may cause a picture defect.

Generally, a gate display device for applying a scan signal to the liquid crystal display panel and a data display device for applying a picture signal to the liquid crystal display panel are mounted on the flexible circuit board. Noise occurs from the display device or the outside in accordance with driving of the driving integrated circuit. This noise is a factor that causes a picture defect due to an error signal when the liquid crystal display device is driven.

In order to prevent such a defect from occurring, a signal processing for reducing the noise should be performed. However, the signal processing is complicated, and even if the signal processing is performed, there is a limitation in fully reducing the noise caused by various factors.

Figure 2A:
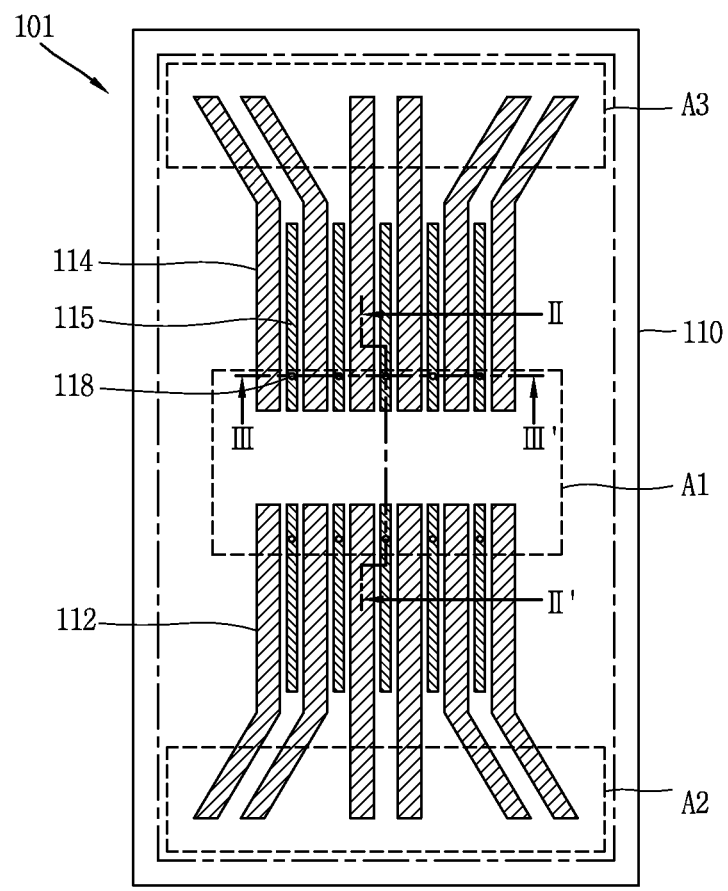
FIG. 2A is a plan view illustrating an example of a flexible circuit board for a semiconductor package.
Figure 2B:
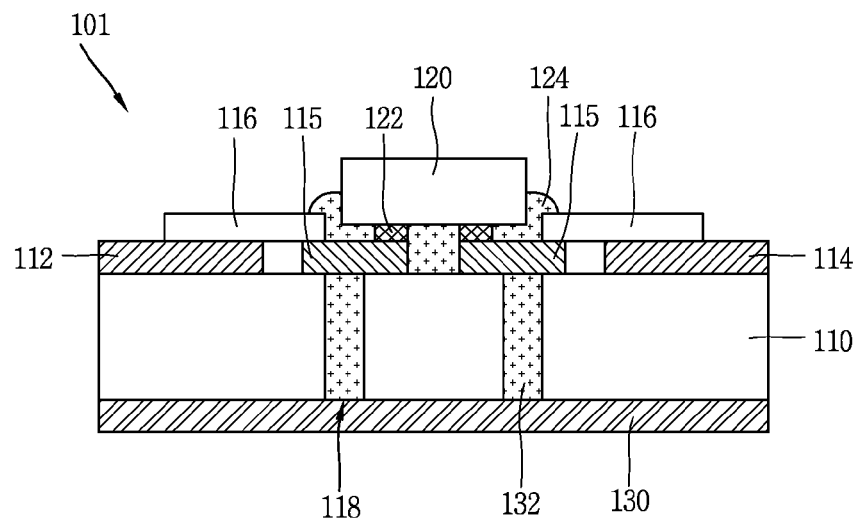
FIG. 2B is a cross-sectional view of the flexible circuit board of FIG. 2A taken along line II-II', in which a semiconductor device is mounted.
Figure 2C:
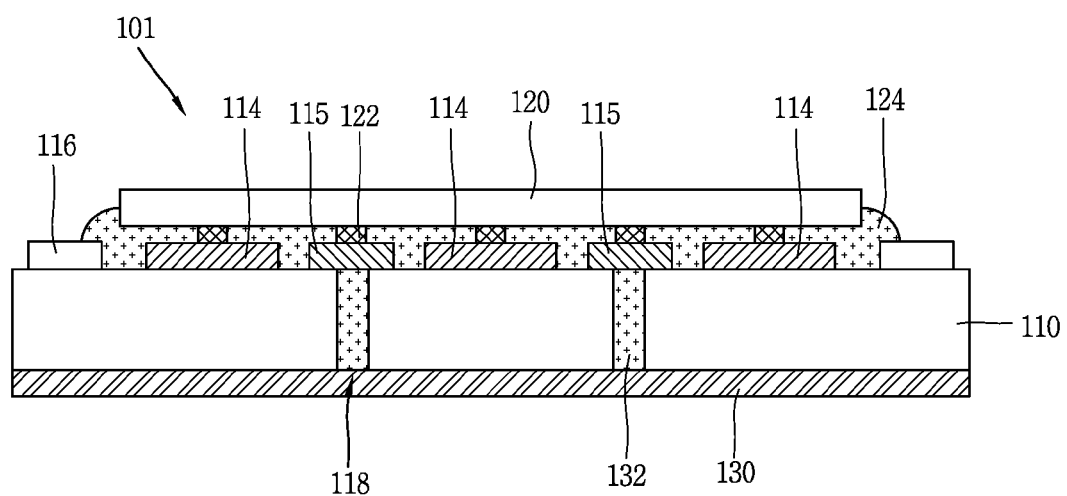
FIG. 2C is a cross-sectional view of the flexible circuit board of FIG. 2A taken along line III-III', in which a semiconductor device is mounted.

FIG. 2A to FIG. 2C illustrate another example of a flexible circuit board for a semiconductor package. FIG. 2A illustrates a plan view of the flexible circuit board. FIG. 2B illustrates a cross-sectional view of the flexible circuit board taken along line II-II' of FIG. 2A, and illustrates a display device 120 mounted on a first surface of a base film. FIG. 2C illustrates a cross-sectional view of the flexible circuit board taken along line III-III' of FIG. 2A.

As shown in FIG. 2A to FIG. 2C, a flexible circuit board 101 includes a base film 110, which includes an inner lead region A1 where the display device 120 is mounted and an outer lead regions A2 and A3 attached to an external device and connected to an external circuit (not shown), an input line pattern 112 and an output line pattern 114 formed on a first surface of the base film 110, the input line pattern 112 being electrically connected with the display device 120, applying a signal from an external printed circuit board to the display device 120, and the output line pattern 114 being electrically connected with a liquid crystal display panel and supplying the signal output from the display device to the liquid crystal display panel, a dummy pattern 115 formed on the first surface of the base film 110, into which noise flows, noise being generated from the driving integrated circuit, and a ground pattern 130 formed on a second surface of the base film 110 and electrically connected with the dummy pattern 115 to channel and to eliminate the noise generated from the display device 120 and flown into the dummy pattern 115.

The base film 110 may be made of an insulating material, for example, a material selected from a polymer group that includes polyimide (PI), polyester (PE), polyethylene terephthalate (PET), poly ethylene naphthalene (PEN), poly carbonate (PC), etc.

The input line pattern 112 and the output line pattern 114 are formed in such a manner that a plurality of input line patterns and output line patterns are formed with a predetermined width in a stripe shape and arranged in an inner lead region A1 and outer lead regions A2 and A3 at predetermined intervals. In this example, the input line pattern 112 and the output line pattern 114 are arranged in parallel to reach a predetermined portion of the inner lead region A1 and are bent in the outer lead regions A2 and A3 at a predetermined angle to form a fan shape. However, in other examples, the input line pattern 112 and the output line pattern 114 may be arranged in parallel in the outer lead regions A2 and A3.

Thus, although the input line pattern 112 and the output line pattern 114 are arranged in a specific shape in FIG. 2A, the arrangement of the input line pattern 112 and the output line pattern 114 is not limited to the specific shape illustrated therein, and various shapes and arrangements may be used with respect to the input line pattern 112 and the output line pattern 114, provided the input line pattern 112 and the output line pattern 114 is electrically connected with the display device 120 and is also electrically connected with the external PCB and the liquid crystal display panel.

An end portion of the input line pattern 112 and the output line pattern 114 are respectively arranged in the inner lead region A1 and spaced apart from each other at a predetermined distance.

The input line pattern 112 and the output line pattern 114 may be made of a single metal layer having high conductivity such as Au, Al, or Cu, or a plurality of metal layers of two or more of Au, Al and Cu.

The first outer lead region A2 is attached to the external PCB where various parts are packaged. The external PCB may generate various signals such as a control signal and a picture signal and may apply the generated signals to the display device. The second outer lead region A3 is attached to the display panel provided with a plurality of pixel regions defined by gate and data lines to actually display picture images. One end of the input line pattern 112 is located in the inner lead region A1 and is electrically connected with a terminal (not shown) of the display device 120. The other end is located in the first outer lead region A2 and is electrically connected with the line of external PCB. Also, one end of the output line pattern 114 is located in the inner lead region A1 and is electrically connected with the terminal of the display device 120. The other end is located in the second outer lead region A3 and is electrically connected with a gate pad or a data pad formed in the display panel.

The dummy pattern 115 is formed in a stripe shape to have a predetermined width and is arranged between input line patterns 112 and between the output line patterns 114. At this time, the dummy pattern 115 is spaced apart from the input line pattern 112 and the output line pattern 114 at a predetermined distance. The dummy pattern 115 is not electrically connected with the input line pattern 112 and the output line pattern 114. The dummy pattern 115 is intended to conduct noise occurring in the display device 120, and is formed of a material having high conductivity such as metal to channel and conduct noise occurring in the display device 120. For example, the dummy pattern 115 may be made of a single metal layer having high conductivity such as Au, Al, or Cu, or a plurality of metal layers of two or more of Au, Al and Cu. Particularly, although the input line pattern 112 and the output line pattern 114 may be formed of different materials from each other, the input line pattern 112 and the output line pattern 114 may be made of the same material by the same process in order to simplify the process and to reduce cost of production.

Although not shown, a metal thin film layer for forming a conductive layer through plating may be formed below the dummy pattern 115, the input line pattern 112 and the output line pattern 114 as an under layer. If the dummy pattern 115, the input line pattern 112 and the output line pattern 114 are formed by another process such as, for example, sputtering or the like, the under layer is not required.

One end of the dummy pattern 115 is arranged in the inner lead region A1, and the other end extends to the outside of the inner lead region A1. In this example, when the display device 120 is mounted on the base film 110, the dummy pattern 115 is electrically connected with the terminal of the display device 120. Thus, the noise that occurs when the display device 120 is driven may be directly channeled from the display device 120 to the dummy pattern 115.

The ground pattern 130 formed on the second surface of the base film 110 is formed as one pattern as a whole. For example, the ground pattern 130 may be formed in a rectangular shape similar to that of the base film 110, and similar in size to the area of the base film. However, the shape, size or the surface area of the ground pattern 130 is not limited to a specific shape or size. The ground pattern 130 might not have a hole.

The ground pattern 130 is formed of a single metal layer having high conductivity such as Au, Al, or Cu, or a plurality of metal layers of two or more of Au, Al and Cu. The ground pattern 130 is electrically connected with the dummy pattern 115 formed on the first surface of the base film 110 through a hole 118 formed in the base film 110 and then discharges noise channeled to the dummy pattern 115 thereto. The metal thin film layer may be formed in the ground pattern 130 as the under layer.

In this example, holes 118 are formed in such a manner that at least one hole 118 is formed in a region where the dummy pattern 115 is formed, and electrically connects the dummy pattern 115 with the ground pattern 130. In the drawing, the hole 118 is formed in the inner lead region A1 where the dummy pattern 115 is formed. However, in other examples, the hole 118 may be formed in the region where the dummy pattern 115 is formed, outside of the inner lead region A1. Also, in this example, one hole 118 is formed in the region corresponding to one dummy pattern 115, and one dummy pattern 115 is electrically connected with the ground pattern 130 by one hole 118. However, a plurality of holes 118 may be formed in the region corresponding to one dummy pattern 115, and one dummy pattern 115 may electrically be connected with the ground pattern 130 by the plurality of holes 118. As described above, as the plurality of holes 118 are formed, a path guiding noise is increased, whereby noise may easily be channeled to the dummy pattern 115.

As shown in FIG. 2B, a conductive layer 132 is formed inside the hole 118 to electrically connect the dummy pattern 115 with the ground pattern 130. The conductive layer 132 may be formed simultaneously with the dummy pattern 115 or the ground pattern 130 when the dummy pattern 115 or the ground pattern 130 is formed. In the alternative, the conductive layer 132 may be formed separately from the dummy pattern 115 and the ground pattern 130.

All the dummy patterns 115 formed on the first surface of the base film 110 are connected to one ground pattern 130 formed on the second surface of the base film 110, whereby noise channeled to the dummy pattern 115 is channeled to the ground pattern 130 and then removed.

Meanwhile, the ground pattern 130 is not required to be formed as one integrated pattern. The ground pattern 130 may be formed in a plurality of divided shapes or a specific shape depending on the factors of noise, such as a packaging shape of the display device 120, and shape and position of the dummy pattern 115.

The display device 120 is mounted in the inner lead region A1 of the first surface of the base film 110 and fixed to the base film 110 by a resin 124. For example, the terminal (not shown) of the display device 120 may be connected with the input line pattern 112, the output line pattern 114 and the dummy pattern 115 through a bonding member 122 such as a bump. Generally, a plurality of input and output terminals are formed in the display device 120. In this example, the input terminal of the display device 120 is connected to the input line pattern 112 through the bonding member 122. The output terminal of the display device 120 is connected to the output line pattern 114 through the bonding member 122. The terminal other than the input and output terminals is electrically connected with the dummy pattern 115 through the bonding member 122. Thus, the noise generated from the driving integrated circuit, the input line pattern 112 and the output line pattern 114 or the noise applied from the outside may be channeled to the ground pattern 130 through the dummy pattern 115.

An insulating layer 116 such as a solder resist is deposited on the first surface of the base film 110 where the display device 120 is mounted, so as to protect the input line pattern 112, the output line pattern 114 and the dummy pattern 115. As illustrated, the insulating layer 116 may not be formed over the entire surface of the first surface. For instance, the insulating layer 116 may not be not formed in the first outer lead region A2 and the second outer lead region A3. In such an example, the input line pattern 112 and the output line pattern 114 of the first outer lead region A2 and the second outer lead region A3 may be externally exposed and provided in the display device, and the input line pattern 112 and the output line pattern 114 may be connected with the line of the PCB and the pad of the display device, respectively.

As described above, in the illustrated example, the dummy pattern 115 is formed on the first surface of the base film 110, the ground pattern 130 is formed on the second surface thereof, and the dummy pattern 115 and the ground pattern 130 are electrically connected to each other through a hole 118 formed in the base film 110.

Accordingly, when the display device 120 mounted on the base film 110 is driven, in the event that noise occurs or is applied externally, the noise is channeled to the dummy pattern 115 and transmitted to the ground pattern 130 through a metal layer 132 inside the hole 118. Thus, the noise may be removed from the ground pattern 130. As a result, the noise occurring on the first surface may be reduced.

Although the ground pattern 130 may be formed to have any shape or size, since the noise is channeled to the ground pattern 130 and then removed, in one example, the ground pattern 130 is formed to have a shape or a size sufficient to remove the noise.

Also, the ground pattern 130 may be connected to a top case of the display device or may be in contact with the top case physically, so as to externally discharge the noise, wherein the top case is made of a metal material.

Hereinafter, an example of a method for forming the aforementioned flexible circuit board will be described with reference to the drawings.

FIG. 3A to FIG. 3E are views illustrating an example of a method for manufacturing a flexible circuit board for a semiconductor package according to the above description. FIG. 3A to FIG. 3E illustrate cross-sectional views of the printed circuit board during its formation taken along line II-II' of FIG. 2.

Figure 3A:
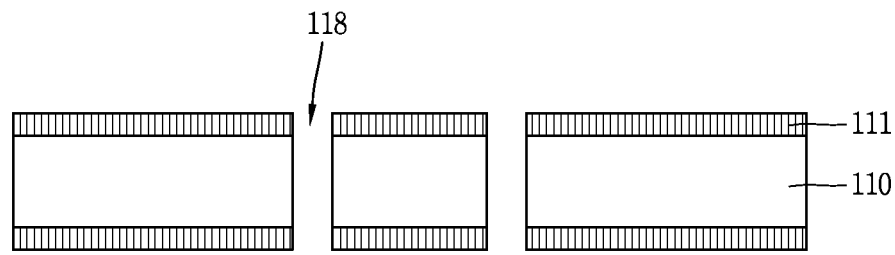
FIG. 3A to FIG. 3E are cross-sectional views of a flexible circuit board that illustrate an example of a method for manufacturing the flexible circuit board.

First of all, as shown in FIG. 3A, the base film 110 made of a polymer such as PI (polyimide), PE (polyester), PET (Polyethylene Terephthalate), PEN (poly ethylene napthalene), and PC (poly carbonate), and provided with a metal thin film layer 111 on the first and second surfaces is prepared. Then, the hole 118 is formed at a position set using a laser, for example.

Figure 3B:
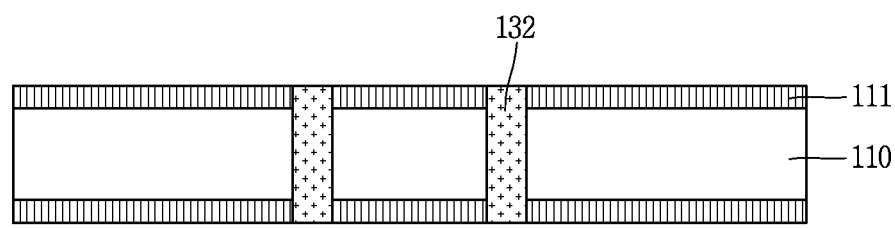

Subsequently, as shown in FIG. 3B, a metal layer 132 is formed inside the hole 118 with a high conductivity material such as A by a sputtering method, and the like.

Figure 3C:
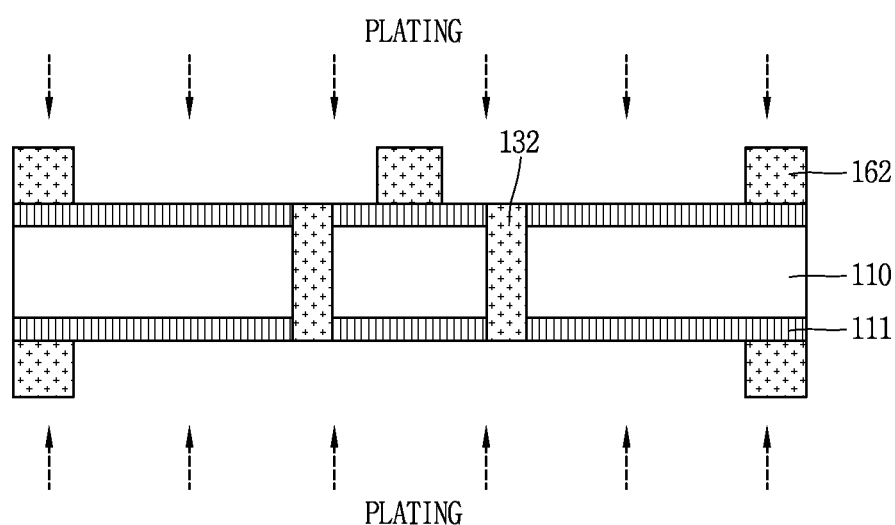

Afterwards, as shown in FIG. 3C, a photoresist is deposited on both surfaces of the base film 110, and a photoresist pattern 162 is formed by developing the photoresist through a photolithography process. Then, metal layers 112a and 114a such as Au, Al and Cu are deposited on the thin film layer 111 on the first and second surfaces, which are exposed through the photoresist pattern 162 by a plating method.

Figure 3D:
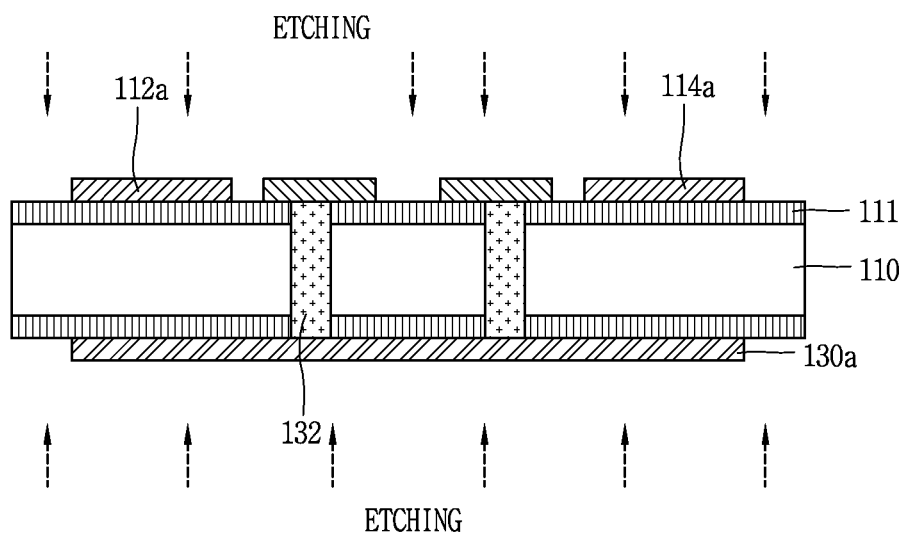

Subsequently, as shown in FIG. 3D, the photoresist pattern 162 is stripped to form the input line pattern 112, the output line pattern 114 and the dummy pattern 115 on the metal thin film layer 111 of the first surface of the base film 110 and form the ground pattern 130 on the metal thin film layer 111 of the second surface of the base film 110.

Figure 3E:
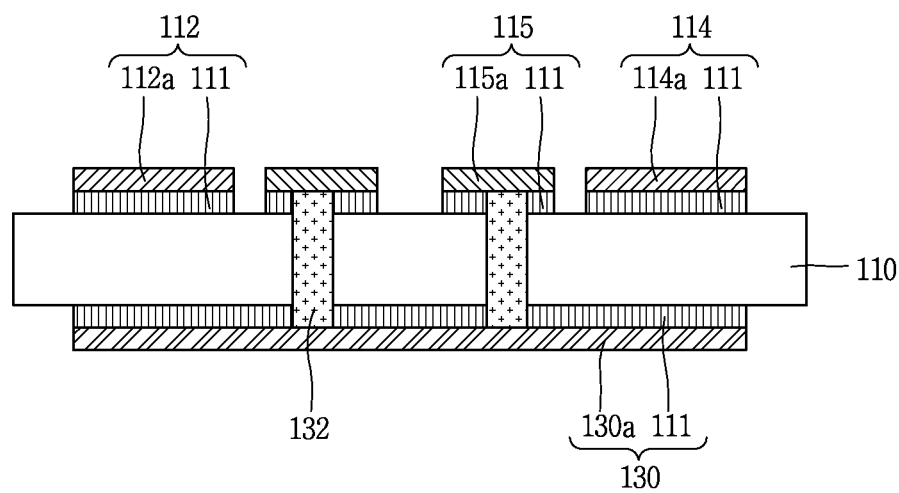

Afterwards, as shown in FIG. 3E, the metal thin film layer 111 is etched using the input line pattern 112, the output line pattern 114, the dummy pattern 115 and the ground pattern 130 as mask layers to form a circuit, and the solder resist is deposited on the first surface of the base film 110 except for the inner lead region A1, the first outer lead region A2 and the second outer lead region A3, whereby the flexible circuited board 101 is completed. Meanwhile, the patterns 112, 114, 115 and 130 may form a surface treatment layer for improvement of a bonding force and prevention of oxidation.

In the example described above, the input line pattern 112, the output line pattern 114, the dummy pattern 115 and the ground pattern 130 may be formed on the base film 110 by a plating method. However, the flexible circuit board of the present description is not always formed by such a method. For example, the input line pattern 112, the output line pattern 114, the dummy pattern 115 and the ground pattern 130 may be formed by a photo etching process using a photoresist and an etching solution after a conductive material is deposited on the first and second surfaces of the base film 110 by a sputtering process.

After the display device 120 is arranged on the inner lead region A1 of the flexible circuit board 101 manufactured as above and then mounted by thermal compression, the mounted portion is doped with resin.

The flexible circuit board where the display device 120 is mounted on is completely provided in the display device in such a manner that the first outer lead region A2 is bonded to the PCB of the display device and the second outer lead region A3 is attached to the pad region of the display device.

Figure 4A:
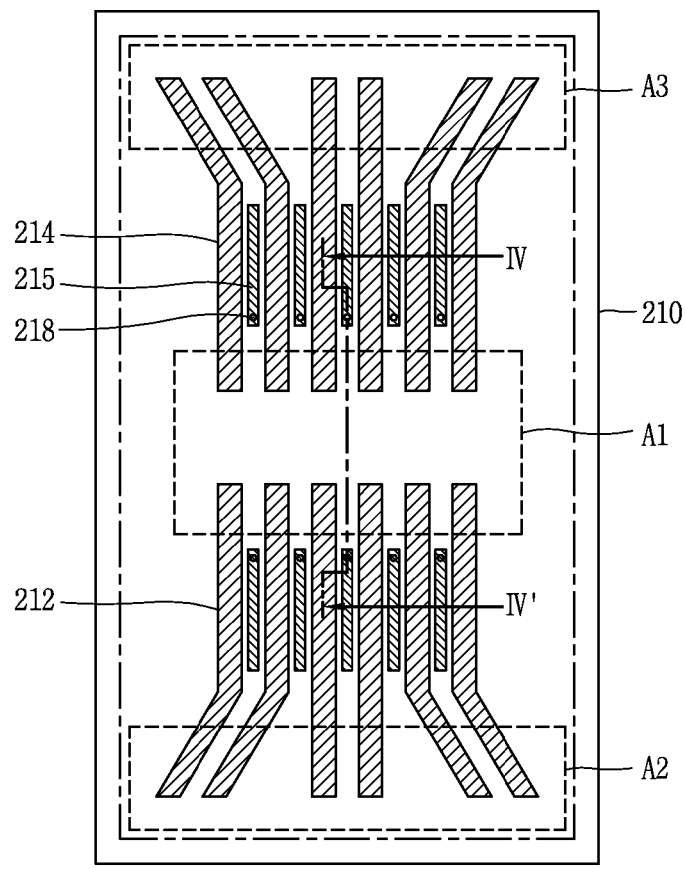
FIG. 4A is a plan view of another example of a flexible circuit board for a semiconductor package.

FIG. 4A illustrates a plan view of an example of a flexible circuit board for a semiconductor package according to another general aspect. In this example, the structure of the flexible circuit board is similar to that of the first example illustrated in FIG. 2A except for the shape and position of the hole of the dummy pattern. Accordingly, descriptions regarding the same structures as illustrated in FIG. 2A will be omitted for conciseness, and structures that are different will be described with respect to FIG. 4A.

Figure 4B:
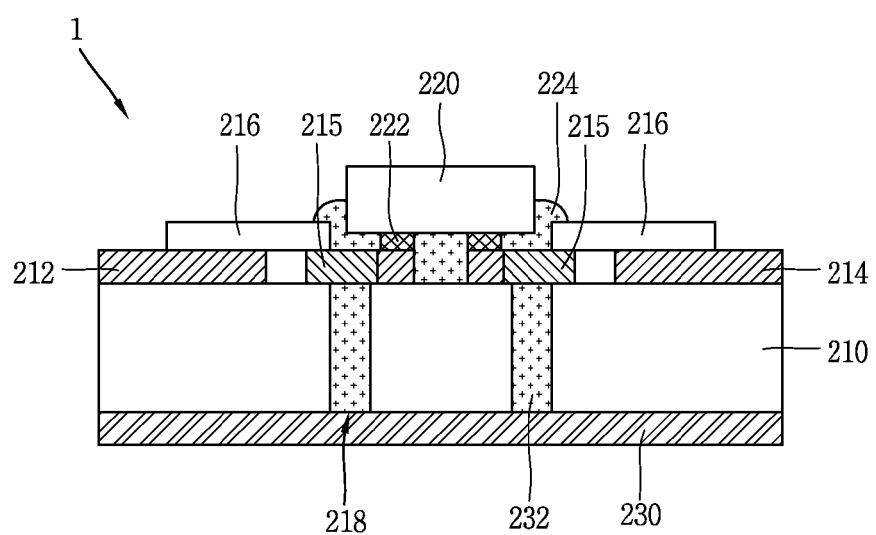
FIG. 4B is a cross-sectional view taken along line IV-IV' of the flexible circuit board illustrated in FIG. 4A.

As shown in FIG. 4A and FIG. 4B, in the flexible circuit board 201, each of the plurality of dummy patterns 215 is formed between the input line pattern 212 and the output line pattern 214. In the example illustrated in FIG. 2a, the end of the dummy pattern 115 is formed in the inner lead region A1 and directly connected to the display device 120 through a bonding member. However, in this example, since the end of the dummy pattern 215 is not formed in the inner lead region A1, the dummy pattern 215 is formed in an island shape. Thus, the dummy pattern 215 is not connected with the display device 220.

In this example, although the dummy pattern 215 is not connected with the display device 220 and is also insulated from the output line pattern 214 and the portion between the input line patterns 212, after noise caused by driving of the display device 220 is channeled from the terminal of the display device 220 to the dummy pattern 215 or from the portion between the input line patterns 212 or the output line pattern 214 to the dummy pattern 215, the noise is transmitted to the ground pattern 230 formed on the second surface of the base film 210 and then removed.

Although one hole 218 is formed in the region where the dummy pattern 215 is formed in this example, two or more holes 218 may be formed in other examples. This hole 218 may be formed anywhere the dummy pattern 215 is formed.

FIG. 5A to FIG. 5D are plan views illustrating examples of flexible circuit boards for a semiconductor package according to additional general aspects.

Figure 5A:
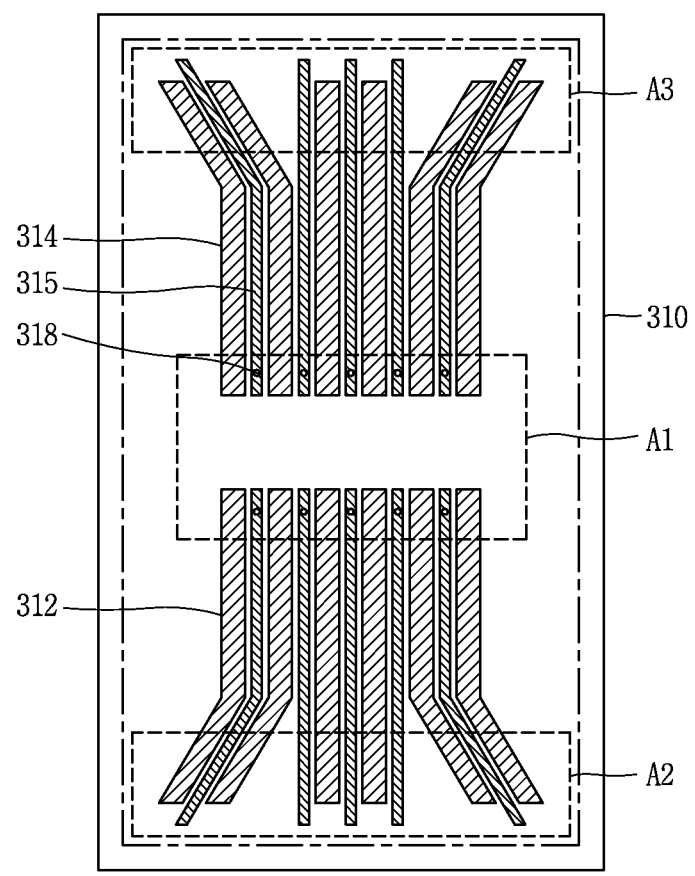
FIG. 5A to FIG. 5D are plan views of additional examples of flexible circuit boards.

As shown in FIG. 5A, in the illustrated flexible circuit board, each of a plurality of dummy patterns 315 is formed between input line patterns 312 and between output line patterns 314. The dumpy pattern 315 extends from the inner lead region A1 to the first outer lead region A2 and the second outer lead region A3. The dummy pattern 315 arranged in the inner lead region A1 is directly connected with the terminal of the display device by a bonding member such as a bump. In this example, because the first outer lead region A2 and the second outer lead region A3 are bent, the shape of the dummy pattern 315 is also bent from the first outer lead region A2 and the second outer lead region A3.

In the example illustrated in FIG. 2A, the length of the dummy pattern 115 is shorter than that of the input line pattern 112 and the output line pattern 114. However, in the example illustrated in FIG. 5A, the length of the dummy pattern 315 is substantially the same as that of the input line pattern 312 and that of the output line pattern 314. As described above, in the present description, the length of the dummy pattern 314 may vary depending on examples, and is not limited to a specific length. Likewise, the dummy pattern 314 may be formed to have various lengths depending on the types of noise that is being eliminated.

Figure 5B:
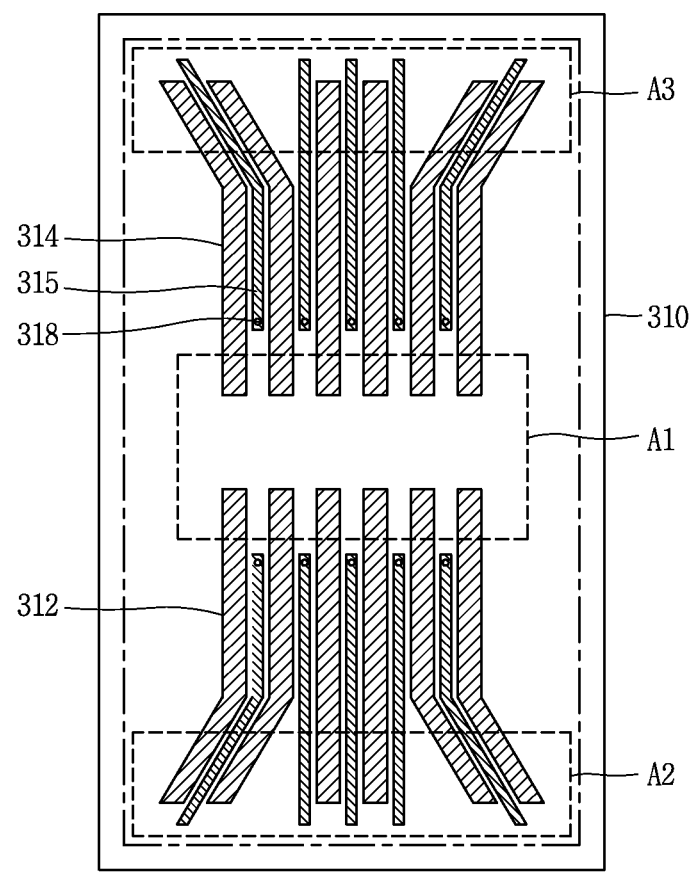

FIG. 5B illustrates another example of a flexible circuit board. In this example, the dummy pattern 315 extends to the first outer lead region A2 and the second outer lead region A3 and has a length almost similar to that of the input line pattern 312 and the output line pattern 314. For example, the length of the dummy pattern 315 is at least 80% of the length of the input line pattern 312 or the output line pattern 314, between which it is disposed. However, since the dummy pattern 315 is not formed in an inner lead region A1, it is formed in an island shape that is not directly connected to the driving integrated circuit.

Figure 5C:
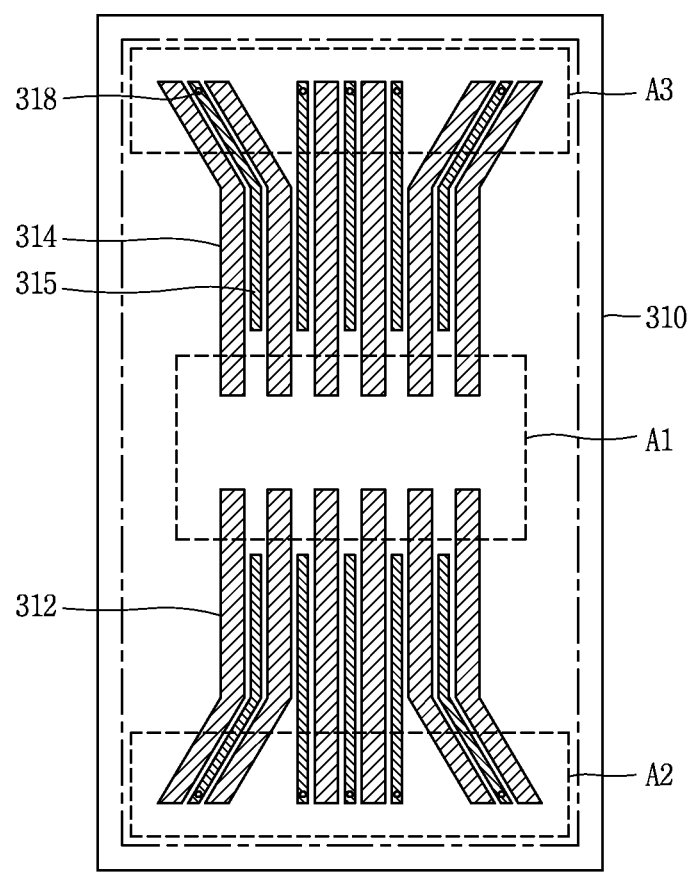

In the fifth embodiment shown in FIG. 5C, each of the plurality of dummy patterns 315 is formed between the input line patterns 312 and between the output line patterns 314. The dumpy pattern 315 extends from the inner lead region A1 to the first outer lead region A2 and the second outer lead region A3. The dummy pattern 315 arranged in the inner lead region A1 is directly connected with the terminal of the display device by a bonding member such as a bump.

In this example, a hole 332 that connects the dummy pattern 315 with the ground pattern 330 is formed in the first outer lead region A2 and the second outer lead region A3.

In other words, although the structure of this example is substantially the same as that of the printed circuit board illustrated in FIG. 4A, the hole is formed in an inner lead region A1 in the example illustrated in FIG. 4A, whereas the hole 332 is formed in the first outer lead region A2 and the second outer lead region A3 in this example.

As described above, various examples of printed circuit boards described herein, the hole 332 may be formed in various positions of the base film 310 where the dummy pattern 315 is formed. Namely, in all the examples, the hole 332 may be formed in all the positions of the base film 310 corresponding to the dummy pattern 315 of various shapes if the hole may electrically be connected with the ground pattern 330.

Figure 5D:
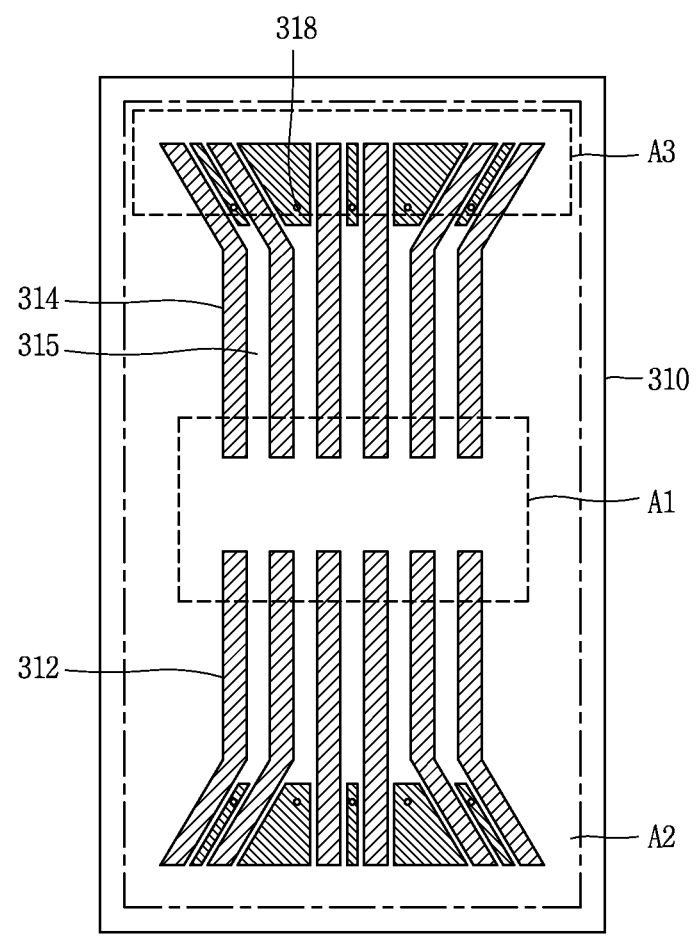

In the example illustrated in FIG. 5D, the dummy pattern 315 is formed near the first outer lead region A2 and the second outer lead region A3. For example, the dummy pattern 315 is spaced apart from the display device at a certain distance. With this structural arrangement, noise occurring when the display device is driven is channeled to the dummy pattern 315 and then transmitted to the ground pattern 330. Thus, the noise may effectively be prevented from entering the display device.

In some examples, the dummy pattern 315 may be formed in a stripe shape of a certain width. In other example, it may be formed in a polygonal shape as shown. Thus, while the dummy pattern 315 is formed in a specific polygonal shape in FIG. 5D, it may be formed in various shapes such as a triangle, a circle, and an oval shape in other examples.

Figure 6A:
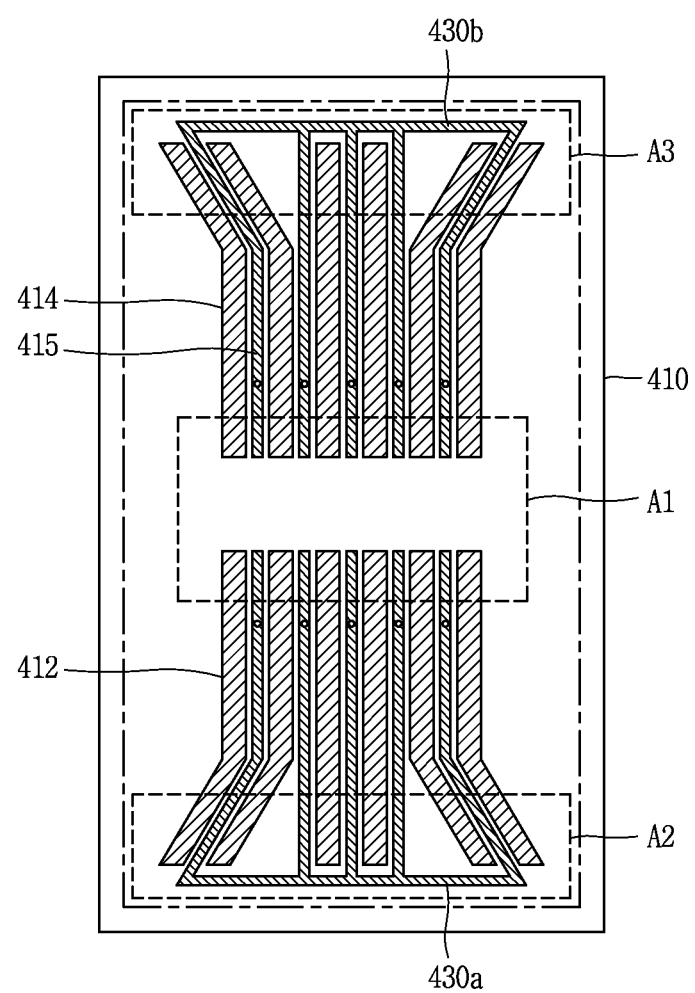
FIG. 6A and FIG. 6B are plan views of additional examples of flexible circuit boards.
Figure 6B:
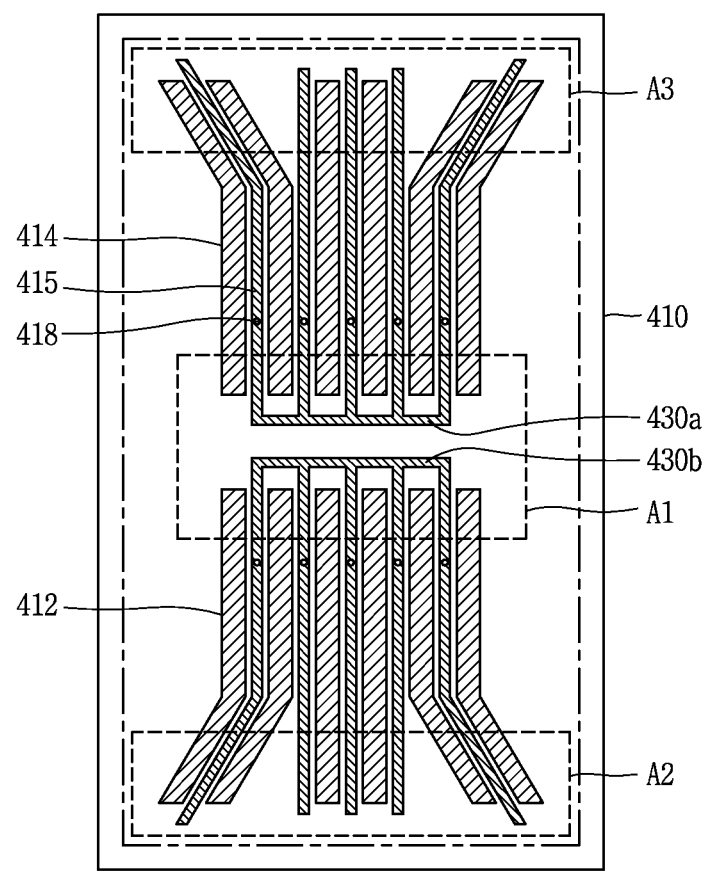

FIG. 6A and FIG. 6B are plan views illustrating a flexible circuit board for a semiconductor package according to the seventh and eighth embodiments of the present invention.

In the example illustrated in FIG. 6A, each of a plurality of dummy patterns 415 extends to the first outer lead region A2 and the second outer lead region A3 and then electrically connected with its adjacent dummy pattern by a first connection pattern 430a and a second connection pattern 430b. In this example, the first connection pattern 430a is connected with all the dummy patterns 415 extended to the first outer lead region A2, and the second connection pattern 430b is connected with all the dummy patterns 415 extended to the second outer lead region A3. However, in other examples, each of the first connection pattern 430a and the second connection pattern 430b may connect the dummy patterns, which are adjacent to each other, with each other, or may connect a predetermined number of the dummy patterns 415 only with one another.

In the example illustrated in FIG. 6B, each of the dummy patterns 415 extends to the outer lead region A1 and then electrically connected with its adjacent dummy pattern 415 by the first connection pattern 430a and the second connection pattern 430b. In this example, all the dummy patterns 415 may be connected with one another by the first connection pattern 430a and the second connection pattern 430b, or only a predetermined number of the dummy patterns 415 may be connected with one another.

As described above, as the dummy patterns 415 are electrically connected with one another by the connection patterns 430a and 430b, various emission paths of noise may be formed, whereby the noise may be channeled to the ground pattern more easily and may be effectively eliminated or reduced.

In various examples of the printed circuit boards described above, the dummy pattern is formed on the first surface of the base film, and the ground pattern is formed on the second surface of the base film, so that the dummy pattern and the ground pattern are electrically connected with each other through the hole formed in the base film. As a result, the noise generated from the display device is transmitted from the dummy pattern to the ground pattern, and the noise may be reduced or eliminated.

While various examples of printed circuit boards were described above with respect to specific structures illustrated in drawings, the printed circuit board according to the present description is not limited to the specific structures. The examples of printed circuit boards may include all the structures based on the basis concept of noise attenuation through the dummy pattern and the ground pattern.

Described above are examples of flexible circuit boards and semiconductor mounted thereon. In these examples, a dummy pattern may be formed on a front surface of a base film, and a ground pattern electrically connected with the dummy pattern may be formed on a rear surface of the base film to easily reduce noise occurring in a driving integrated circuit.

According to various examples, a flexible circuit board may include a base film including a hole which connects a first surface with a second surface; at least one input line pattern, output line pattern, and dummy pattern formed on the first surface of the base film; and a ground pattern formed on the second surface of the base film and electrically connected with the dummy pattern through the hole.

The dummy pattern may be formed in various shapes such as a stripe shape of a predetermined width, a polygonal shape, a circle shape or an oval shape. In this case, the dummy pattern may electrically be connected with or insulated from a driving integrated circuit.

The input line pattern, the output line pattern, the dummy pattern and the ground pattern may equally be formed of a conductive material.

Also described above are various examples of semiconductor packages, including a base film including a hole that connects a first surface with a second surface; at least one input line pattern, output line pattern, and dummy pattern formed on the first surface of the base film; a ground pattern formed on the second surface of the base film and electrically connected with the dummy pattern through the hole of the base film; and a display device mounted on the base film and connected with the input line pattern and the output line pattern.

The display device may electrically be insulated from the ground pattern or may electrically be connected with the ground pattern through a bonding member.

The dummy pattern may be formed on a front surface of the flexible circuit board, and the ground pattern may be formed on a rear surface of the flexible circuit board, by which noise generated from the display device may be channeled to the ground pattern through the dummy pattern and then reduced. Accordingly, according to various examples, the signal distortion caused by the noise may be reduced or eliminated, effectively preventing a defect from occurring in a display device.

The foregoing examples and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the examples described herein may be combined in various ways to obtain additional and/or alternative examples.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A flexible circuit board, comprising:
   a base film;
   a plurality of input line patterns, a plurality of output line patterns, and a plurality of dummy patterns on a first surface of the base film; and
   a ground pattern on a second surface of the base film and electrically connected with one of the plurality of dummy patterns, wherein the plurality of dummy patterns are formed between each of the plurality of input line patterns or between each of the plurality of output line patterns.

2. The flexible circuit board of claim 1, wherein the base film includes a hole, and the ground pattern is electrically connected with the one of the plurality of dummy patterns through the hole.

3. The flexible circuit board of claim 1, wherein the plurality of dummy patterns are connected with an adjacent dummy pattern.

4. The flexible circuit board of claim 1, wherein the plurality of dummy patterns are is formed in a polygonal shape, a circle shape or an oval shape.

5. The flexible circuit board of claim 1, wherein the plurality of input line patterns, the plurality of output line patterns, and the plurality of dummy patterns and the ground pattern comprise a conductive material.

6. The flexible circuit board of claim 1, wherein the base film includes a plurality of holes formed therein, and one of the plurality of dummy patterns electrically connected with the ground pattern through the plurality of holes.

7. The flexible circuit board of claim 6, wherein the hole is filled with a conductive material to electrically connect one of the plurality of dummy patterns with the ground pattern.

8. A semiconductor package, comprising:
   a base film;
   a plurality of input line patterns, a plurality of output line patterns, and a plurality of dummy patterns on a first surface of the base film;
   a ground pattern on a second surface of the base film and electrically connected with the one of the plurality of dummy patterns; and
   a display device mounted on the base film and connected with one of the plurality of input line patterns and one of the plurality of output line patterns, wherein the plurality of dummy patterns are formed between each of the plurality of input line patterns or between each of the plurality of output line patterns.

9. The semiconductor package of claim 8, wherein the base film includes a hole, and the ground pattern is electrically connected with one of the plurality of dummy patterns through the hole.

10. The semiconductor package of claim 8, wherein the display device is electrically connected with one of the plurality of dummy patterns.

11. The semiconductor package of claim 8, wherein the display device is electrically insulated from the plurality of dummy patterns.

12. A flexible circuit board comprising:
- a base film comprising an inner lead region where a display device is mounted and an outer lead region bonded with an external device;
- a plurality of input line patterns and a plurality of output line patterns on a first surface of the base film;
- at least one dummy pattern on the first surface of the base film; and
- a ground pattern on a second surface of the base film and connected with the dummy pattern through a hole provided in the base film, the at least one dummy pattern being configured to channel noise to the ground pattern, wherein the at least one dummy pattern is formed between each of the plurality of input line patterns or between each of the plurality of output line patterns.

13. A semiconductor package comprising:
- a base film comprising an inner lead region where a display device is mounted and an outer lead region bonded with an external device;
- a plurality of input line patterns and a plurality of output line patterns on a first surface of the base film;
- at least one dummy pattern on the first surface of the base film;
- a ground pattern on a second surface of the base film and connected with the dummy pattern through a hole provided in the base film, the at least one dummy pattern being configured to channel noise to the ground pattern; and
- a display device mounted on the inner lead region of the base film and connected with one of the plurality of input line patterns and one of the plurality of output line patterns, wherein the at least one dummy patterns is formed between each of the plurality of input line patterns or between each of the plurality of output line patterns.

* * * * *